(12) United States Patent
Yug et al.

(10) Patent No.: US 12,208,470 B2
(45) Date of Patent: Jan. 28, 2025

(54) SUBSTRATE-STACKING STRUCTURE AND SUBSTRATE-CUTTING METHOD

(71) Applicant: SAMSUNG DISPLAY CO., LTD., Yongin-si (KR)

(72) Inventors: Geunwoo Yug, Seoul (KR); Muhyun Kim, Seoul (KR); Sungwoo Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 208 days.

(21) Appl. No.: 17/401,135

(22) Filed: Aug. 12, 2021

(65) Prior Publication Data
US 2022/0143755 A1 May 12, 2022

(30) Foreign Application Priority Data
Nov. 6, 2020 (KR) ......................... 10-2020-0147843

(51) Int. Cl.
*B23K 26/38* (2014.01)
*H01L 21/78* (2006.01)

(52) U.S. Cl.
CPC .............. *B23K 26/38* (2013.01); *H01L 21/78* (2013.01)

(58) Field of Classification Search
CPC ........... B23K 2101/40; B23K 2103/54; B23K 26/0622; B23K 26/082; B23K 26/38; B23K 26/402; B23K 26/60; B23K 2103/42; B23K 103/00; H01L 21/78; H01L 2225/06565; H01L 2225/06575; H01L 25/0657; H01L 25/50; H01L 31/0445; H01L 31/0392; H10K 71/851; C03B 33/074; C03B 33/078; C03B 33/091; C03B 33/093; C03B 33/033; C03B 33/105; C03B 33/07; C03B 33/09; C03B 33/027; C03B 33/10; F21V 13/08;
(Continued)

(56) References Cited

U.S. PATENT DOCUMENTS 6,376,769 B1 * 4/2002 Chung .................... B32B 33/00
257/E23.07
8,110,776 B2 2/2012 Jung et al.
(Continued)

FOREIGN PATENT DOCUMENTS

KR   10-2009-0053314   5/2009
KR     10-1388181     4/2014
(Continued)

*Primary Examiner* — Dana Ross
*Assistant Examiner* — Adam M Eckardt
(74) *Attorney, Agent, or Firm* — F. CHAU & ASSOCIATES, LLC

(57) ABSTRACT

A substrate-cutting method includes preparing a first substrate in which a plurality of first active areas spaced apart from each other and a first non-active area surrounding the first active areas are defined in a plane, forming an adhesive layer on the first substrate where the adhesive layer is disposed within the first active areas, disposing a second substrate in which a plurality of second active areas spaced apart from each other and a second non-active area surrounding the second active areas are defined in the plane, and cutting a cutting line of the second substrate, which corresponds to a boundary between the second active areas and the second non-active area, using a laser beam. The adhesive layer does not overlap the cutting line of the second substrate.

12 Claims, 11 Drawing Sheets

(58) Field of Classification Search
CPC .......... F21V 14/003; F21V 7/048; F21V 7/05;
F21V 7/22; F21V 13/02; F21V 14/00;
F21V 7/04; F21V 9/40; G02B 5/02;
G02B 5/045; G02B 5/04; G02F 1/1334;
G02F 1/13; G02F 1/1333; Y02E 10/50;
B32B 17/10; B28D 5/00; H05B 33/02;
H05B 33/10; H05B 33/14
See application file for complete search history.

(56) References Cited

U.S. PATENT DOCUMENTS

| | | |
|---|---|---|
| 9,156,206 B2 | 10/2015 | Masuda |
| 10,424,758 B2 | 9/2019 | Kyoung |
| 2005/0173789 A1* | 8/2005 | Hsuan ..................... H01L 25/50 |
| | | 257/E21.705 |
| 2016/0093827 A1* | 3/2016 | Han ..................... H10K 59/122 |
| | | 257/40 |
| 2017/0066679 A1 | 3/2017 | Yeh |
| 2020/0303209 A1* | 9/2020 | Lee ......................... H01L 21/52 |

FOREIGN PATENT DOCUMENTS

| | | | | |
|---|---|---|---|---|
| KR | 10-2014-0129153 | | 11/2014 | |
| KR | 10-2016-0052955 A | | 5/2016 | |
| KR | 10-1854653 | | 5/2018 | |
| WO | 2012164612 | | 12/2012 | |
| WO | WO-2013119737 A2 * | | 8/2013 | ............. B23K 26/40 |

* cited by examiner

SUBSTRATE-STACKING STRUCTURE AND SUBSTRATE-CUTTING METHOD

CROSS-REFERENCE TO RELATED APPLICATION

This U.S. non-provisional patent application claims priority under 35 U.S.C. § 119 to Korean Patent Application No. 10-2020-0147843, filed on Nov. 6, 2020, the contents of which are incorporated by reference herein in its entirety.

TECHNICAL FIELD

The present disclosure relates to a substrate-cutting method. More particularly, the present disclosure relates to a substrate-stacking structure and a substrate-cutting method of stacked substrates.

DISCUSSION OF TRE RELATED ART

Display devices may be used in various electronic devices, such as a smartphone, a tablet personal computer, a laptop computer, a digital camera, a camcorder, and a portable information terminal, or an electronic product, such as a slim TV, a display sign, and a billboard.

Recently, there has been increased demand to manufacture slimmer display devices. Among the display devices, there has been special attention on flexible display devices as the next generation display device since they are easy to carry and capable of being applied to various-shaped devices. In particular, flexible display devices based on organic light-emitting display technology are regarded as the most popular display devices.

Fabrication of such display devices may involve cutting a plurality of stacked display substrates to mass-produce the display device and to it prove work efficiency. For example, each of the display substrates includes a plurality of display devices spaced apart from each other and a cutting line defined in each of the display substrates is cut by a laser beam. However, in some conventional display substrates, damage may occur to the substrates during the cutting process due to vibrations.

SUMMARY

The present disclosure provides a substrate-stacking structure capable of preventing a substrate from being damaged when the substrate is cut, and a method of cutting the substrate according to the present inventive concept.

Embodiments of the inventive concept provide a substrate-cutting method that includes preparing a first substrate in which a plurality of first active areas spaced apart from each other and a first non-active area surrounding the first active areas are defined in a plane, forming an adhesive layer on the first substrate where the adhesive layer is disposed within the first active areas, disposing a second substrate in which a plurality of second active areas spaced apart from each other and a second non-active area surrounding the second active areas are defined in the plane on the adhesive layer, and cutting the second substrate along a second cutting line, where the second cutting line corresponds to a boundary between the second active areas and the second non-active area, using a laser beam. The adhesive layer does not overlap the cutting line of the second substrate.

In some embodiments of the present inventive concept, the first active areas respectively overlap the second active areas in the plane. The first active areas have shapes that correspond to to shapes of the second active areas in the plane.

In some embodiments of the present inventive concept, the adhesive layer includes a plurality of adhesive portions respectively overlapping the first active areas, and the adhesive portions are spaced apart from each other. The adhesive layer may further include a sub-adhesive portion overlapping the first non-active area.

Each of the adhesive portions may have the same shape and be directly attached to the first substrate.

The substrate-cutting method further includes cutting the first substrate along a first cutting line, where the first cutting line corresponds to a boundary between the first active areas and the first non-active area, after the cutting of the second substrate along the second cutting line using the laser beam.

The substrate-cutting method further includes disposing a suction pad onto the second substrate overlapping the second non-active area after the cutting of the second substrate along the second cutting line using the laser beam and removing the second substrate overlapping the second non-active area using the suction pad.

The substrate-cutting method further includes removing the first substrate overlapping the first non-active area using the suction pad after the removing of the second substrate overlapping the second non-active area.

The forming of the adhesive layer includes disposing a mask through which openings respectively corresponding to the first active areas are defined on the first substrate and coating a resin on the mask.

Each of the openings may be disposed within the first active areas, which may be outside of the first and second cutting lines.

The substrate-cutting method further includes curing the resin. Embodiments of the inventive concept provide a method of cutting a plurality of substrates stacked one on another with an adhesive layer interposed therebetween. The method includes disposing a laser module above a first substrate in which a first active area and a first non-active area surrounding the first active area are defined and cutting the first substrate along a first cutting line, where the first cutting line corresponds to a boundary between the first active area and the first non-active area, using the laser module. The first substrate is disposed at an uppermost position among the substrates. The adhesive layer is disposed between each of two substrates adjacent to each other among the substrates, and may be within a first active area, and outside of the first cutting line.

The method further includes cutting a a second substrate along a second cutting line, where the second substrate is adjacent to the first substrate in a thickness direction with the adhesive layer interposed therebetween after the cutting of the first, substrate along the first cutting line. The second cutting line corresponds to a boundary between a second active area and a second non-active area surrounding the second active area defined in the second substrate.

The first cutting line overlaps the second cutting line.

The first active area surrounds the adhesive layer in the plane.

Embodiments of the inventive concept provide a substrate-stacking structure including a first substrate it which a plurality of active areas spaced apart from each other and a non-active area surrounding the active areas are defined, a plurality of adhesive portions disposed on the first substrate and respectively overlapping the active areas, and a second substrate disposed on the adhesive portions. The adhesive portions are disposed within the active areas.

Each of the adhesive portions has the same shape, and is attached to the first substrate.

The forming of the adhesive portions includes coating a resin on the first substrate using a mask through which a plurality of openings corresponding to the active areas and curing the resin coated on the first substrate.

The method further includes aligning the first substrate and the second substrate after forming the adhesive portions.

According to the above, the adhesive layer is disposed between the substrates stacked one on another. As two substrates adjacent to each other are spaced apart from each other due to the adhesive layer, a friction between the two substrates are prevented when cutting the substrates using the laser beam.

Accordingly, a process efficiency and a process reliability in cutting plural substrates stacked one on another are is improved.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
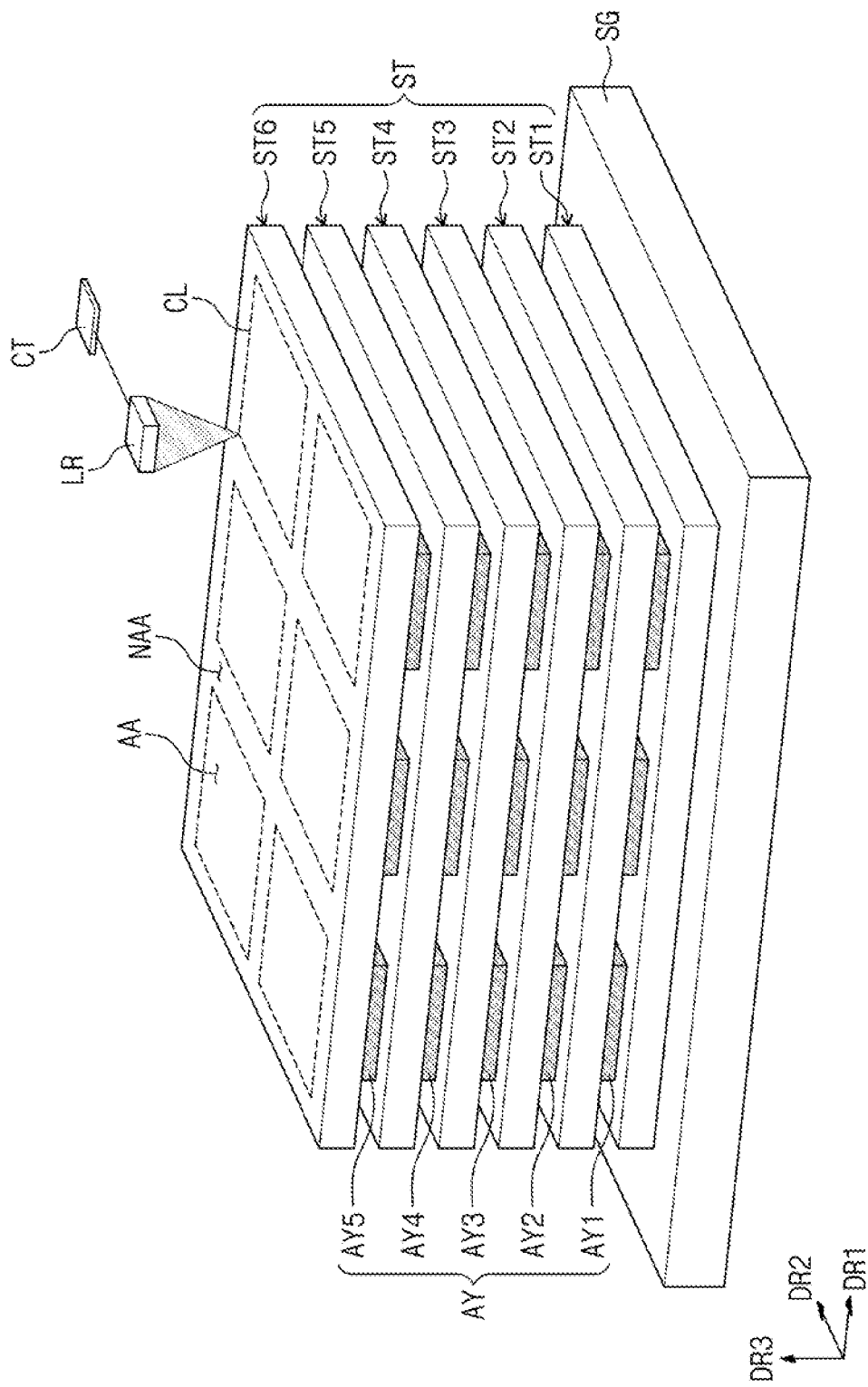
FIG. 1 is a perspective view showing a substrate-cutting apparatus according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the specification. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another. Thus, a first element, component region, layer or section discussed below could be termed a second element, component, region, layer or section without departing from the teachings of the present disclosure. As used herein, description of a singular element may be applied to a plurality of the same element, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the terms "comprise", "have", or "include are intended to specify the presence of stated features, integers, steps, operations, elements, components, or combinations thereof in the disclosure, but do not necessarily preclude the presence or addition of one or more other features, integers, steps, operations, elements, components, or combinations thereof.

Hereinafter, the present disclosure will be explained in detail with reference to the accompanying drawings.

FIG. 1 is a perspective view showing a substrate-cutting apparatus according, to an embodiment of the present disclosure.

Referring to FIG. 1, the substrate-cutting apparatus may include a stage SG supporting a plurality of substrates ST, an adhesive layer AY, a laser module LR configured to cut the substrates ST, and a controller CT that may control the laser module LR.

The stage SG may have a quadrangular shape and may support the substrates ST. The stage SG may include a material with sufficient strength to support the substrates ST.

Each of the substrates ST is substantially parallel to a plane defined by a first direction DR1 and a second direction DR2. For example, the directions DR1 and DR2 may span a horizontal plane. A third direction DR3 may be defined as a direction normal to the plane of the substrates ST, or a vertical direction. The third direction DR3 may also be referred to as a thickness direction. In the following descriptions, a expression "when viewed in a plan view" or "in a plane" may refer to a view in the third direction DR3; for example, a top-down view. Hereinafter, front (or upper) and rear (or lower) surfaces of each layer or each unit are distinguished from each other by the third direction DR3. However, directions indicated by the first, second, and third directions DR1, DR2, and DR3 are relative to each other, and thus, the directions indicated by the first, second, and third directions DR1, DR2, and DR3 may be changed to other directions, e.g., opposite directions.

According to an embodiment of the present disclosure, the substrates ST may be stacked one on another. Each of the substrates ST may include a plurality of active areas AA and a non-active area NAA adjacent to the active areas AA. The substrates ST may be aligned with each other in the third vertical) direction DR3. In particular, the active areas AA of two substrates adjacent to each other among the substrates ST may substantially overlap each other and may correspond to each other in the third direction DR3.

The active areas AA of each of the substrates ST may be applied to an actual display device, and the non-active area NAA may be a residual area generated after a cutting process. The active areas AA may be spaced apart from each other when viewed in a plane and may be surrounded by the non-active area NAA. The active areas AA defined in each of the substrates ST may correspond to a plurality of windows including a glass, respectively.

However, the present disclosure is not necessarily limited thereto, and the active areas AA defined in each of the substrates ST may mean a display module, or a single base substrate included in the display module. The display module may include at least one of: a display panel displaying an image and an input sensing unit sensing an external input.

In the following descriptions, a boundary line between the active areas AA and the non-active area NAA will be described as a cutting line CL. For example, as a laser beam, which is output from a laser module LR described later, is irradiated onto the cutting line CL, the active areas AA of each of the substrates ST may be separated from each other.

Hereinafter, the substrates ST will be described as including first, second, third, fourth, fifth, and sixth substrates ST1, ST2, ST3, ST4, ST5, and ST6 stacked one on another. The second substrate ST2, the third substrate ST3, the fourth substrate ST4, the fifth substrate ST5, and the sixth substrate ST6 may be sequentially stacked on the first substrate ST1. The first substrate ST1 may be directly disposed on the stage SG. That is, the first substrate ST1 may be a substrate disposed at a lowermost position among the substrates ST, and the sixth substrate ST6 may be a substrate disposed at an uppermost position among the substrates ST.

The laser module LR may include a laser beam generator emitting the laser beam and an optical system disposed on a path of the laser bean. The laser beam generator may include a solid laser, such as a ruby laser, a glass laser, an yttrium aluminum garnet (YAG) laser, a yttrium lithium fluoride (YLF) laser, or the like, a gas laser, such as an excimer laser, a helium-neon (He—Ne) laser, or the like, or a pulsed laser.

The optical system may be disposed on a path that follows the laser beam. The optical system may include a homogenizer to homogenize a shape of the laser beam or a condensing lens to focus the laser beam. In addition, the optical system may include at least one mirror disposed on the path of the laser beam to change an angle of the laser beam. The mirror may include a Galvano mirror or a reflective mirror whose angle is changed according to a change in an input voltage.

The controller CT may control a position of the laser module LR or an intensity and a size of the laser beam. The controller CT may move the position of the laser module LR such that the laser beam is irradiated onto the substrates ST along the cutting line CL of the substrates ST. The laser module LR may move in the first direction DR1 and the second direction DR2.

According to an embodiment of the present disclosure, the adhesive layer AY may be disposed between the substrates ST. Two substrates adjacent to each other among the substrates ST may be spaced apart from each other in the third direction DR3 by the adhesive layer AY. The substrates ST may be stacked with the adhesive layer AY interposed therebetween.

The adhesive layer AY may include first, second, third, fourth, and fifth adhesive layers AY1, AY2, AY3, AY4, and AY5. The first adhesive layer AY1 may be disposed between the first substrate ST1 and the second substrate ST2. The first substrate ST1 and the second substrate ST2 may be spaced apart from each other in the third direction DR3 with the first adhesive layer AY1 interposed therebetween.

Similarly, the second adhesive layer AY2 may be disposed between the second substrate ST2 and the third substrate ST3. The second substrate ST2 and the third substrate ST3 may be spaced apart from each other in the third direction DR3 with the second adhesive layer AY2 interposed therebetween.

The third adhesive layer AY3, the fourth adhesive layer AY4, and the fifth adhesive layer AY5 may also have a structure similar to that of the first adhesive layer AY1 and the second adhesive layer AY2 described above. For instance, the third adhesive layer AY3 may be disposed between the third substrate ST3 and the fourth substrate ST4, where the fourth substrate ST4 is spaced apart from the third substrate ST3 in the third direction DR3. The fourth adhesive layer AY4 may be disposed between the fourth substrate ST4 and the fifth substrate ST5, where the fifth substrate ST5 is spaced apart from the fourth substrate ST4 in the third direction DR3. The fifth adhesive layer AY5 may be disposed between the fifth substrate ST5 and the sixth substrate ST6, where the sixth substrate ST6 spaced apart from the fifth substrate ST5 in the third direction DR3.

In a case were the adhesive layer AY is omitted, the stacked two substrates may be in contact with each other. In this case, a vibration may occur on the substrates stacked on each other when the laser beam is irradiated onto the cutting line. Due to the vibration, a friction may occur between the substrates, and thus, the substrates may be damaged.

According to the present disclosure, the adhesive layer AY may be disposed between each of two substrates adjacent to each other among the stacked substrates ST. For example, when the laser beam is irradiated onto the cutting line CL of the sixth substrate ST6, the vibration may occur in the sixth substrate ST6. Since the sixth substrate ST6 and the fifth substrate ST5 are spaced apart from each other by the fifth adhesive layer AY5, the friction between the sixth substrate ST6 and the fifth substrate ST5 caused by the vibration may be prevented. In addition, as the sixth substrate ST6 and the fifth substrate ST5 are held by the fifth adhesive layer AY5, movement of the sixth substrate ST6 and the fifth substrate ST5 may be prevented when the cutting operation is performed by irradiating the laser beam.

As described above, when the stacked substrates ST are cut along the cutting line CL, the damage of the substrates may be prevented since the friction between the substrates is prevented by the adhesive layer AY.

In addition, according to an embodiment of the present disclosure, the adhesive layer AY may not overlap the cutting line CL. This is because the intensity of the laser beam may attenuate as the laser beam passes through the adhesive layer. That is, when the laser beam is irradiated onto the cutting line of the substrate after passing through the adhesive layer, the substrate may not be cut.

However, since the adhesive layer AY does not overlap the cutting line CL, the intensity of the laser beam irradiated onto the substrates ST may be maintained.

Figure 2:
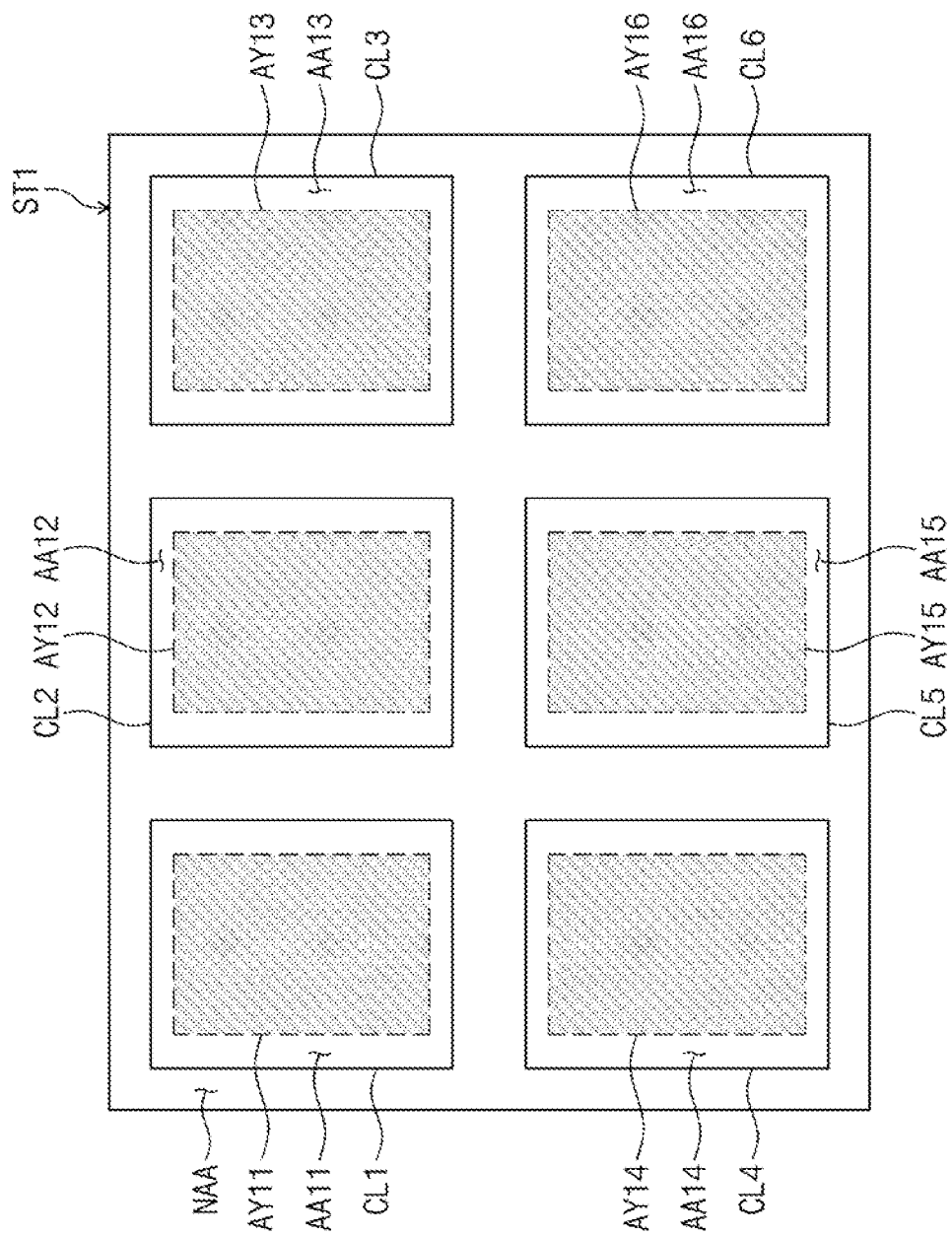
FIG. 2 is a plan view showing a first substrate according to an embodiment of the present disclosure.
Figure 3A:
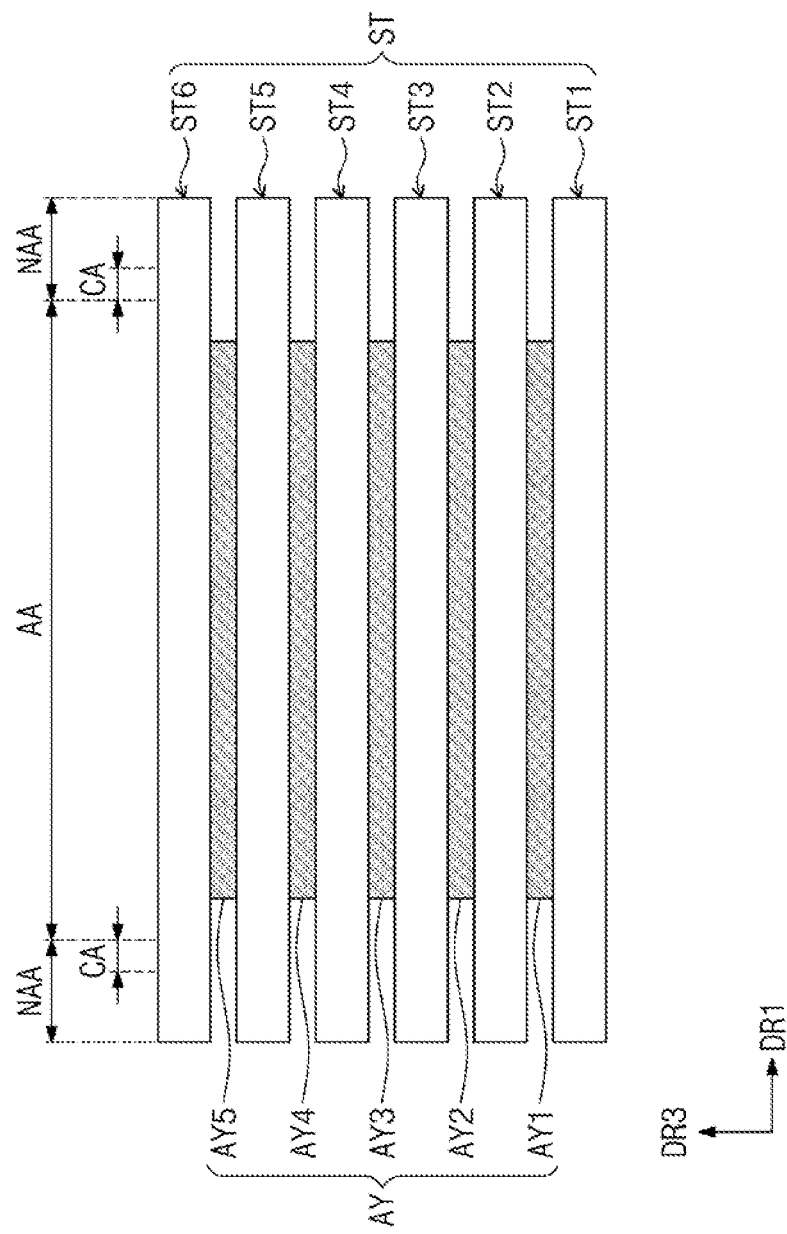
FIG. 3A is a cross-sectional view showing a substrate-cutting apparatus according to an embodiment of the present disclosure.
Figure 3B:
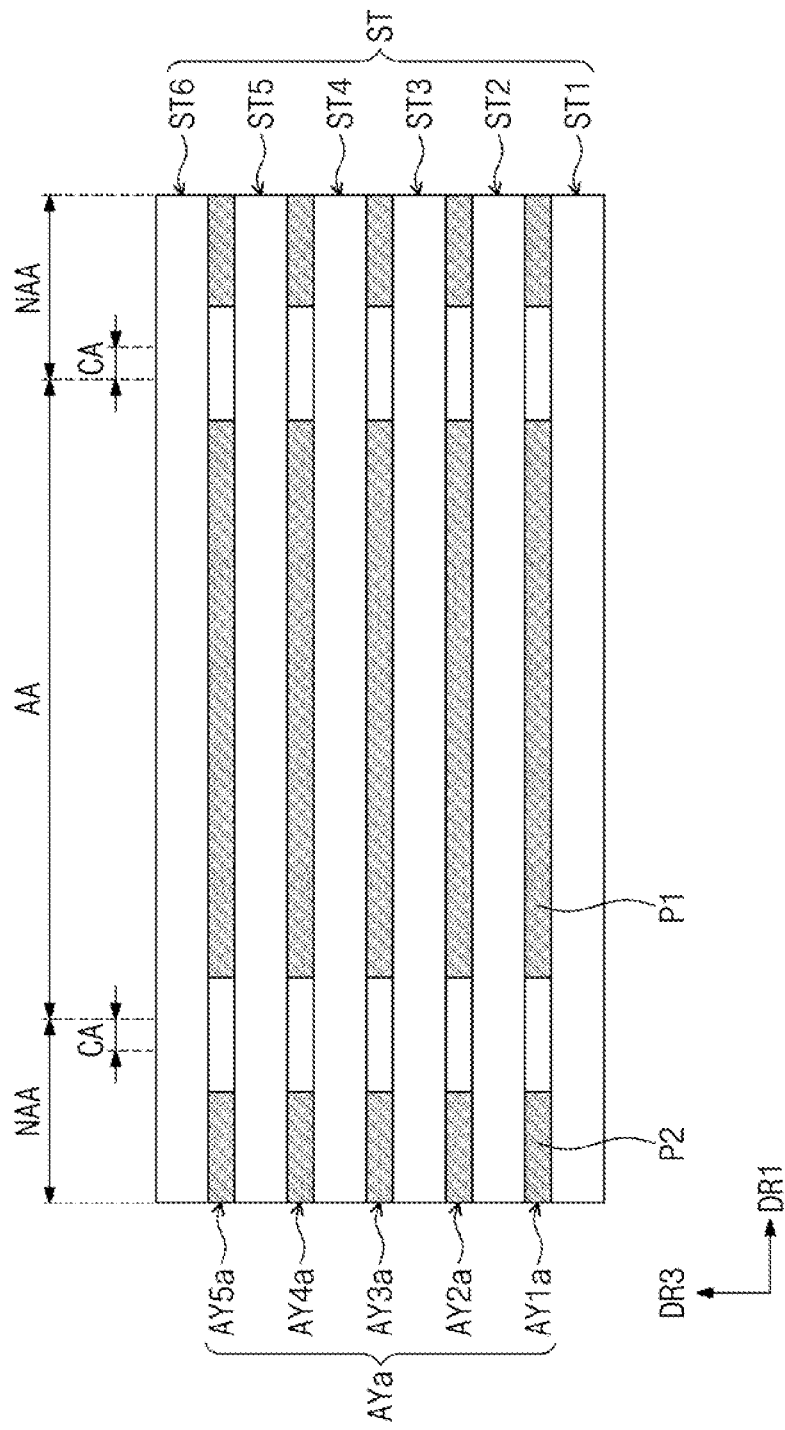
FIG. 3B is a cross-sectional view showing a substrate-cutting apparatus according to an embodiment of the present disclosure.

FIG. 2 is a plan view showing the first substrate ST1 according to an embodiment of the present disclosure. FIG. 3A is a cross-sectional view showing the substrate-cutting apparatus according to an embodiment of the present disclosure. FIG. 3B is a cross-sectional view showing the substrate-cutting apparatus according to an embodiment of the present disclosure.

FIG. 2 is a plan view of the first substrate ST1. The first substrate ST1 may include first, second, third, fourth, fifth, and sixth active areas AA11, AA12, AA13, AA14, AA15, and AA16 which are spaced apart from each other when viewed in a plane. The non-active area NAA may surround the first to sixth active areas AA11 to AA16.

A first cutting line CL1 may correspond to a boundary between the first active, area AA11 and the non-active area NAA. A second cutting line CL2 may correspond to a boundary between the second active area AA12 and the non-active area NAA. A third cutting line CL3 may correspond to a boundary between the third active area AA13 and the non-active area NAA. A fourth cutting line CL4 may correspond to a boundary between the fourth active area AA14 and the non-active area NAA. A fifth cutting line CL5 may correspond to a boundary between the fifth active area AA15 and the non-active area NA. A sixth cutting line CL6 may correspond to a boundary between the sixth active area AA and the non-active area NAA.

The second to sixth substrates ST2 to ST6 may include active areas with substantially the same structure as that of the first substrate ST1.

The first adhesive layer AY1 disposed under the first substrate ST1 may include first, second, third, fourth, fifth, and sixth adhesive portions AY11, AY12, AY13, AY14, AY15, and AY16 respectively overlapping a center portion of the first to sixth active areas AA11 to AA16. For example, the first to sixth adhesive portions AY11, AY12, AY13, AY14, AY15, and AY16 may not overlap the first to sixth cutting lines CL1 to CL6.

For example, as shown in FIG. 2, the first active area AA11 may surround the first adhesive portion AY11 then viewed in a plane. Similarly, the second to sixth active areas AA12 to AA16 may respectively surround the second to sixth cutting lines CL2 to CL6 when viewed in a plane.

Referring to FIG. 3A, each of the first to fifth adhesive layers AY1 to AY5 may overlap at least a center portion of the active area AA and may not overlap the non-active area NAA. In particular, each of the first to fifth adhesive layers AY1 to AY5 may not overlap a cutting area CA corresponding to the cutting line CL shown in FIG. 2. As a result, when the laser beam is irradiated onto the cutting area CA, the laser beam may not passing through the adhesive layer AY.

Referring to FIG. 3B, when compared with the adhesive layer AY shown in FIG. 3A, an adhesive layer AYa may overlap a non-active area NAA. However, the adhesive layer AYa may still not overlap a cutting area CA. As described above, the adhesive layer AYa may be disposed not to overlap the cutting area CA such that the laser beam does not pass through the adhesive layer AYa.

The adhesive layer AYa may include first, second, third, fourth, and fifth adhesive layers AY1a, AY2a, AY3a, AY4a, and AY5a, and each of the first to fifth adhesive layers AY1a to AY5a may be disposed between two corresponding substrates among the first to sixth substrates ST1 to ST6. For example, the first adhesive layer AY1a may be disposed between the first substrate ST1 and the second substrate ST2, the second adhesive layer AY2a may be disposed between the second substrate ST2 and the third substrate ST3, and so on. Each of the first to fifth adhesive layers AY1a to AY5a shown in FIG. 3B may include a first adhesive portion P1 and a second adhesive portion P2, which are spaced apart from each other with the cutting area CA interposed therebetween. The first adhesive portion P1 may overlap an active area AA and may correspond to the adhesive portion shown in FIG. 2. The second adhesive portion P2 may overlap the non-active area NAA. In the following descriptions, the second adhesive portion P2 may be referred to as a sub-adhesive portion.

Figure 4A:
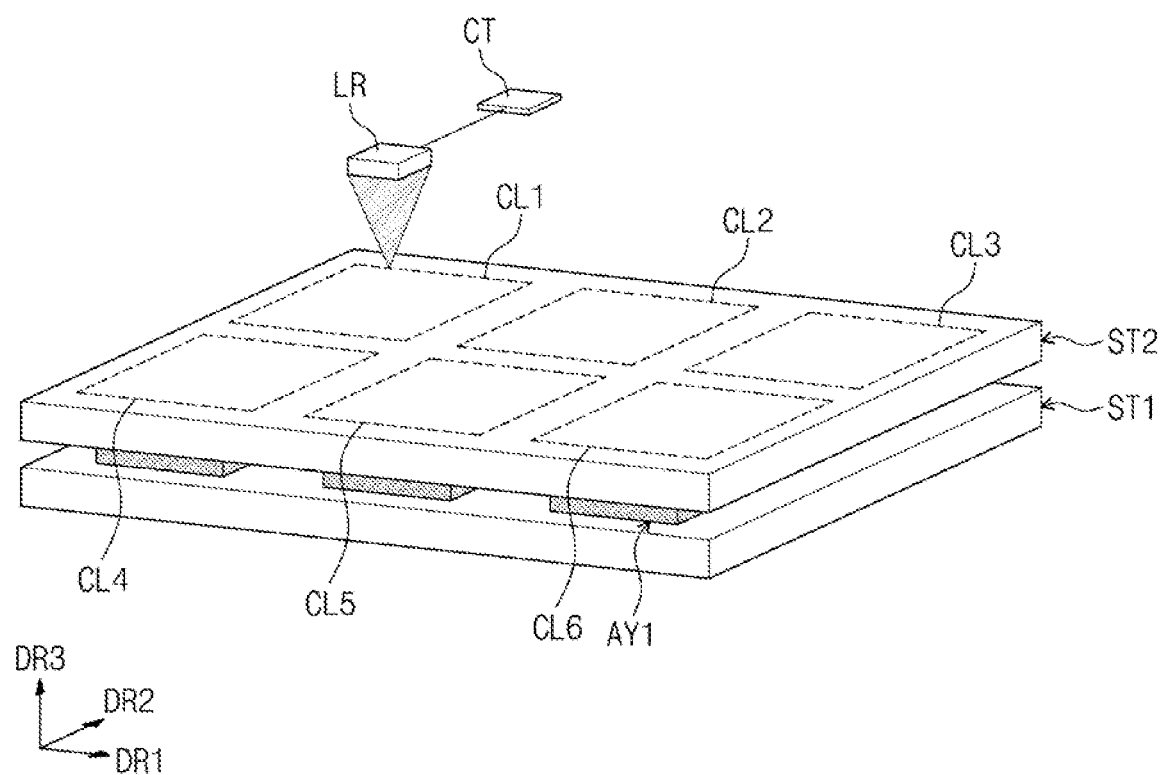
FIGS. 4A to 4C are perspective views showing a substrate-cutting method according to an embodiment of the present disclosure.
Figure 4B:
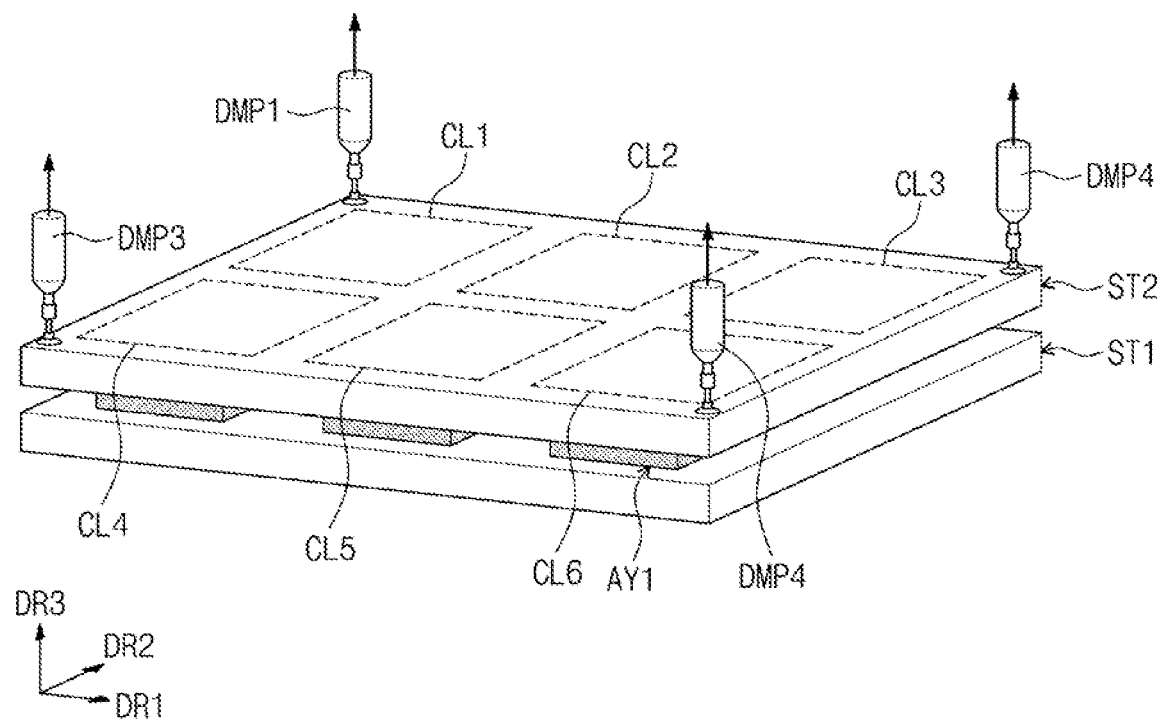
Figure 4C:
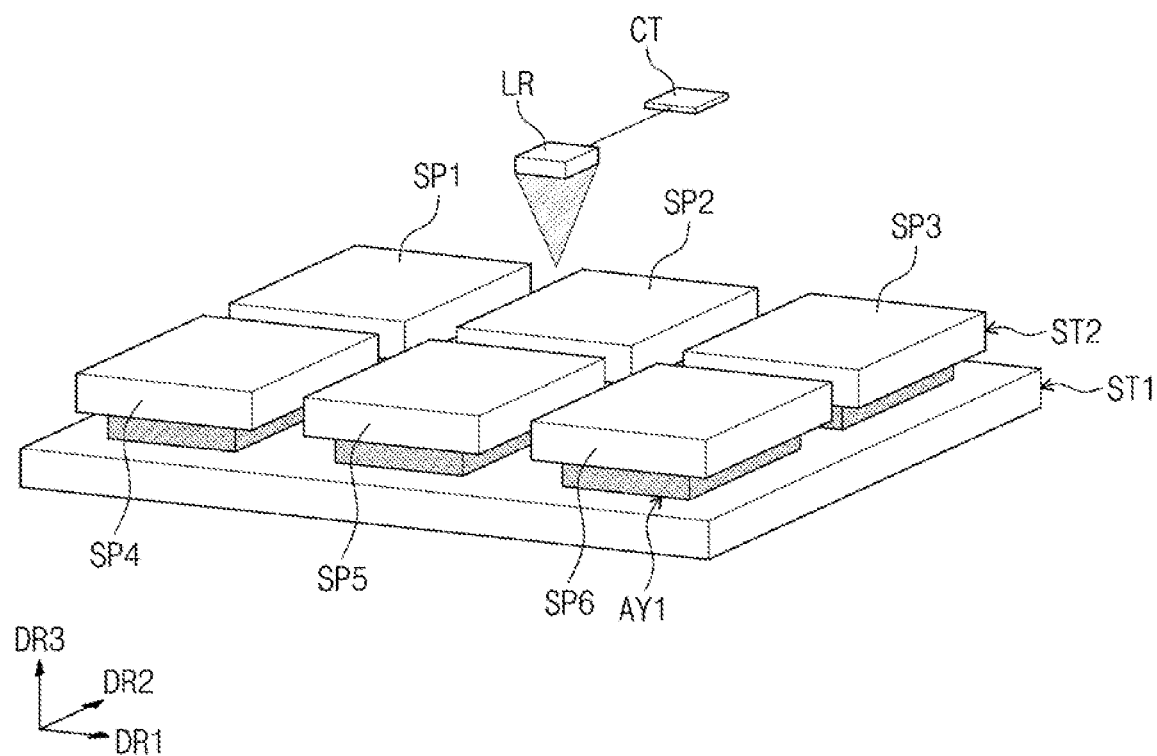

FIGS. 4A to 4C are perspective views showing a substrate-cutting method according to an embodiment of the present disclosure.

In FIG. 4A, the first substrate ST1 and the second substrate ST2 among the stacked substrates ST shown in FIG. 1 are shown. The method of cutting the two stacked substrates ST1 and ST2 is described with reference to FIGS. 4A, 4B, and 4C, however, a method of cutting the plural substrates ST (e.g., more than two substrates) may be substantially the same as the cutting method of the two stacked substrates ST1 and ST2.

The laser beam may be irradiated onto each of the first to sixth cutting lines CL1 to CL6 defined in the second substrate ST2 by the laser module LR. The first adhesive layer AY1 may not overlap the first to sixth cutting lines CL1 to CL6 and may be disposed between the first substrate ST1 and the second substrate ST2.

Referring to FIG. 4B, the substrate-cutting apparatus according to the present disclosure may further include suction pads DMP1, DMP2, DMP3, and DMP4. After the first to sixth cutting lines CL1 to CL6 are cut using the laser module LR, the suction pads DMP1 to DMP4 may be suctioned to the second substrate ST2. For example, four suction pads DMP1 to DMP4 may be disposed at four corners of the second substrate ST2, respectively.

The suction pads DMP1 to DMP4 may move in the third direction DR3, and accordingly, after a cut process is performed, a portion of the second substrate ST2 which corresponds to the non-active area NAA (refer to FIG. 2), may be removed.

Referring to FIG. 4C, as the portion of the second substrate ST2, which corresponds to the non-active area NAA, is removed, first, second, third, fourth, fifth, and sixth active portions SP1, SP2, SP3, SP4, SP5, and SP6 respectively corresponding to the first to sixth active areas AA11 to AA16 shows in FIG. 2 may be formed. Each of the first to sixth active portions SP1 to SP6 may be the window applied to the single display device.

The laser module LR may apply the laser beam onto the cutting line of the first substrate ST1 again, and thus, a portion of the first substrate ST1, which overlaps the non-active area, may be removed. As a result, the active portions of the first substrate ST1 may be formed.

Figure 5A:
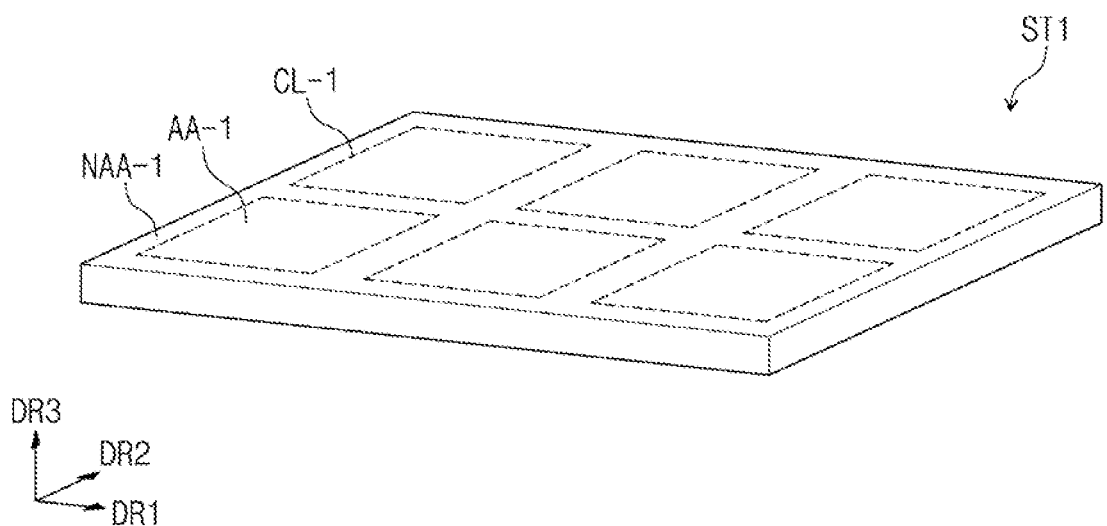
FIGS. 5A to 5C are perspective views showing a method of stacking a plurality of substrates according to an embodiment of the present disclosure.
Figure 5B:
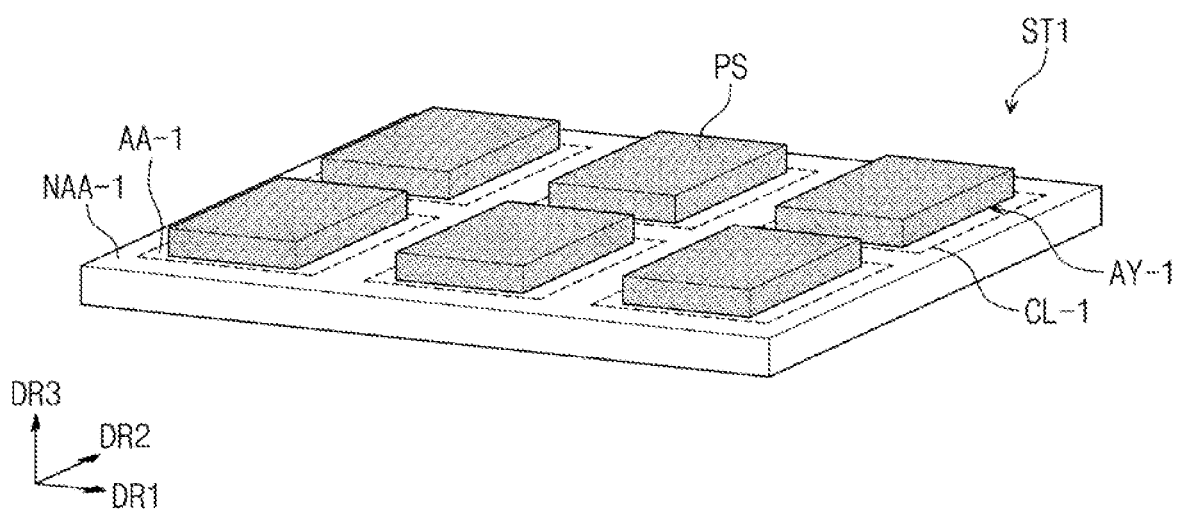
Figure 5C:
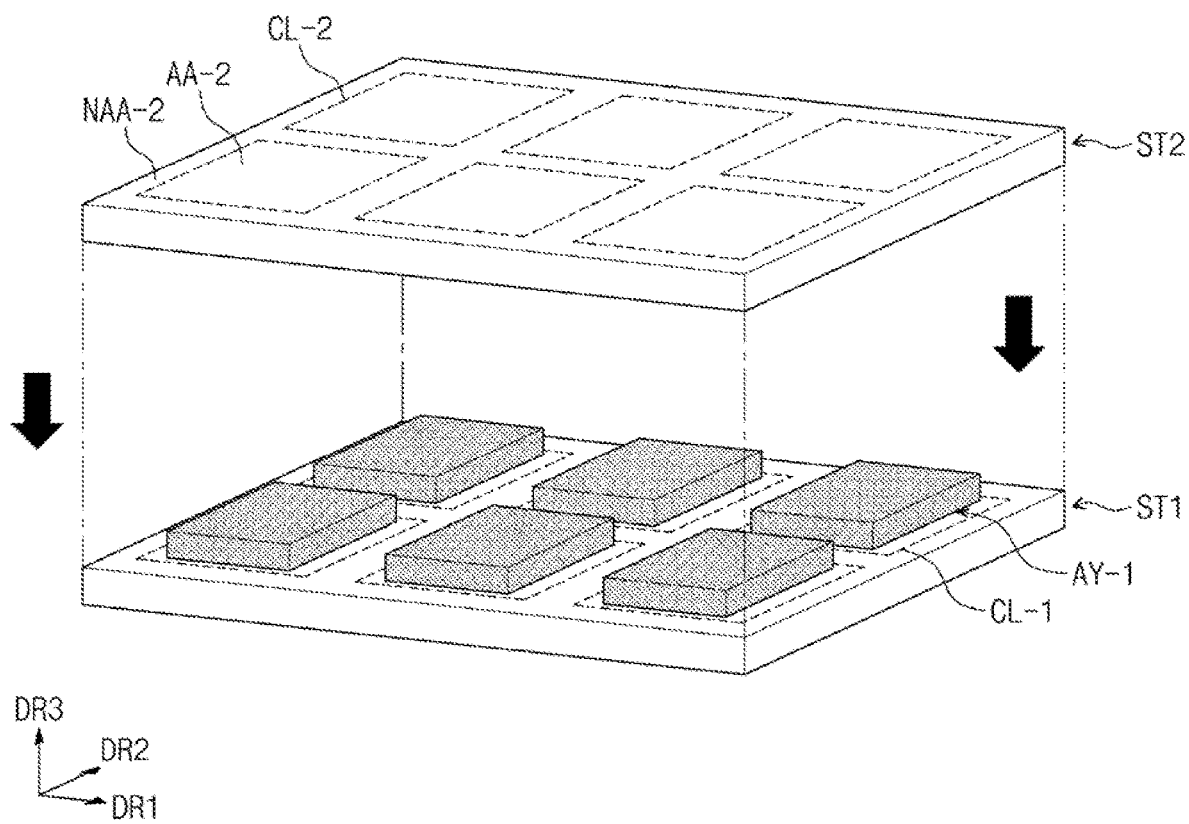

FIGS. 5A to 5C are perspective views showing a method of stacking a plurality of substrates according to an embodiment of the present disclosure.

Referring to FIG. 5A, a first substrate ST1 may be prepared. The first substrate ST1 may include a plurality of first active areas AA-1 and a first non-active area NAA-1 surrounding the first active areas AA-1. A boundary between the first active areas AA-1 and the first non-active area NAA-1 may be defined as a first cutting line CL-1.

Referring to FIG. 5B, a first adhesive layer AY-1 may be disposed on the first substrate ST1 to overlap at least a center portion of the first active areas AA-1. For example, the first adhesive layer AY-1 may include adhesive portions PS respectively overlapping the first active areas AA-1, and each of the adhesive portions PS may be provided in an adhesive resin with a single shape. The adhesive portions PS may not overlap the first cutting line CL1 and may be disposed on the first active areas AA-1, respectively, Referring to FIG. 5C, a second substrate ST2 may be disposed on the first adhesive layer AY-1. The second substrate ST2 may include a plurality of second active areas AA-2 and a second non-active area NAA-2 surrounding, the second active areas AA-2. A boundary between the second active areas AA-2 and the second non-active area NAA-2 may be defined as a second cutting line CL-2.

An alignment operation may be performed on the first substrate ST1 and the second substrate ST2 before the second substrate ST2 is disposed on the first adhesive layer AY-1. Accordingly, the first cutting line CL-1 of the first substrate ST1 and the second cutting line CL-2 of the second substrate ST2 may be aligned with each other in the third direction DR3.

After the alignment operation is performed on the first substrate ST1 and the second substrate ST2, the second substrate ST2 may be ire contact with the first adhesive layer AY-1. Then, the cutting operation may be performed on the substrates ST1 and ST2 using the laser module LR as described with reference to FIGS. 4A to 4C.

FIGS. 6A to 6D illustrate a method of stacking a plurality of substrates according to an embodiment of the present disclosure.

Figure 6A:
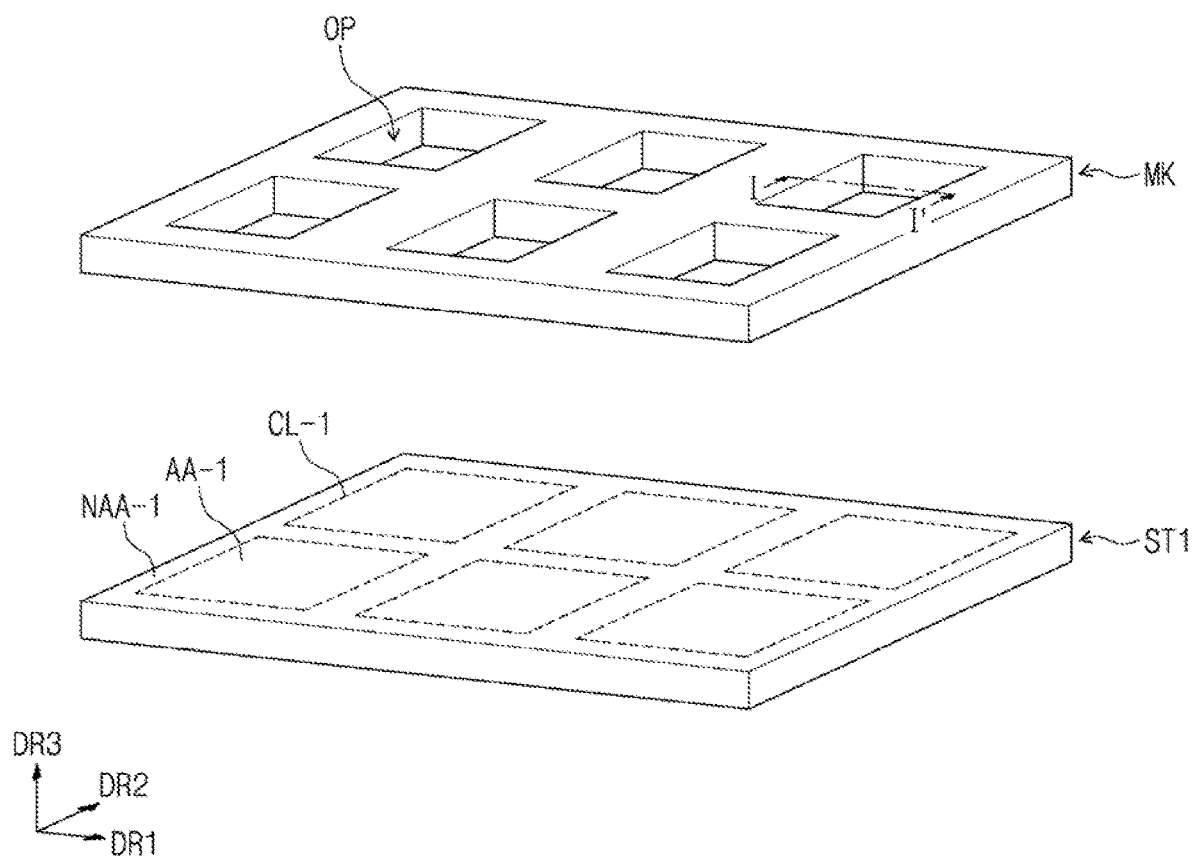
FIGS. 6A to 6D are views showing a method of stacking a plurality of substrates according to an embodiment of the present disclosure.

Referring to FIG. 6A, a first substrate ST1 may have substantially the same configuration as that of the first substrate ST1 described with reference to FIG. 5A. Accordingly, description of the same components will be made with respect to the present embodiment, and in subsequent descriptions, to the extent any description is omitted, it may be assumed that the components are at least similar to those described here.

A mask MK may be disposed on the first substrate ST1 in the process of forming the first adhesive layer AY-1a. The mask MK may be provided with a plurality of opening OP defined therethrough to respectively overlap the first active areas AA-1. The first adhesive layer AY-1a (with reference to FIG. 6C) may be formed on the first substrate ST1 through the openings OP defined through the mask MK.

In particular, each of the openings OP according to the present embodiment may have a smaller size than that of the first active areas AA-1 in a plane. Otherwise, any one adhesive portion among the adhesive portions of the adhesive layer AY-1a may overlap the first cutting line CL-1 when the size of the opening OP is greater than that of the first active areas AA-1. Accordingly, the openings OP according to the present disclosure may have a size smaller than that of the first active areas AA-1 when viewed in a plane.

Figure 6B:
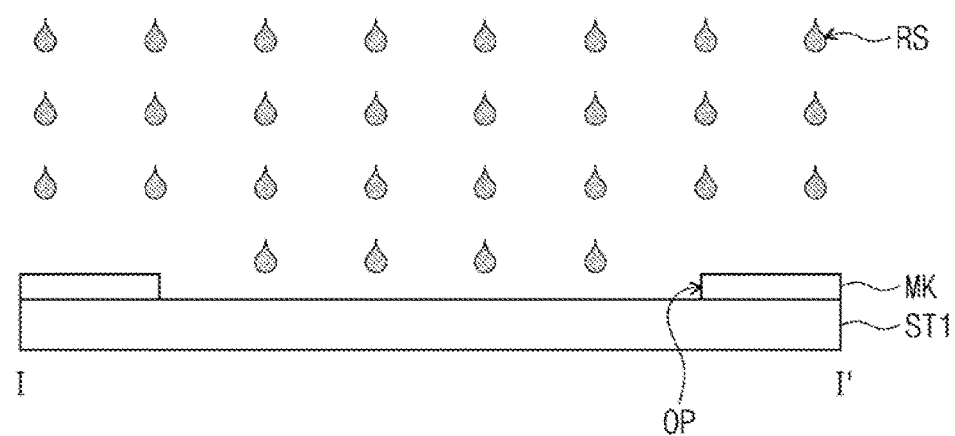

Referring to FIG. 6B, a resin RS may be coated on the first substrate ST1 using the mask MK through which the openings OP are defined. The resin RS may be formed on the first substrate ST1 after passing through the openings OP. The resin RS thrilled on the first substrate ST1 may be cured. As the openings OP overlap at least a center portion of each of the first active areas AA-1, the resin RS may be formed on the first substrate ST1 to overlap at least a center portion of the first active areas AA-1. The resin RS disposed on the mask MK may not be formed on the first substrate ST1.

Figure 6C:
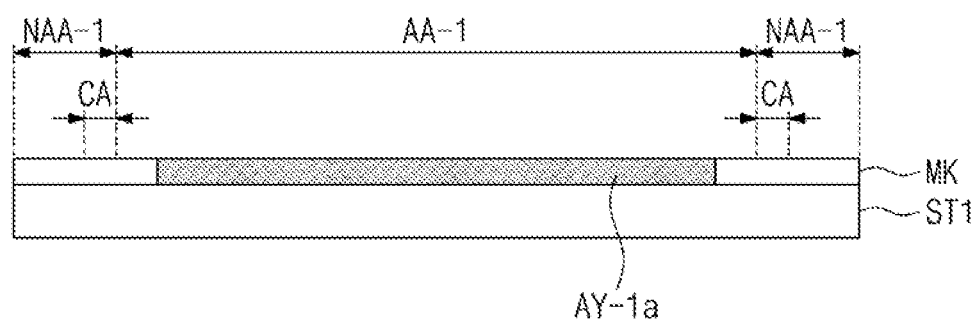

Referring to FIG. 6C, a first adhesive layer AY-1a may be formed through the operation shown in FIG. 6B. The first adhesive layer AY-1a may overlap the first active area AA-1 and may not overlap the cutting area CA.

Figure 6D:
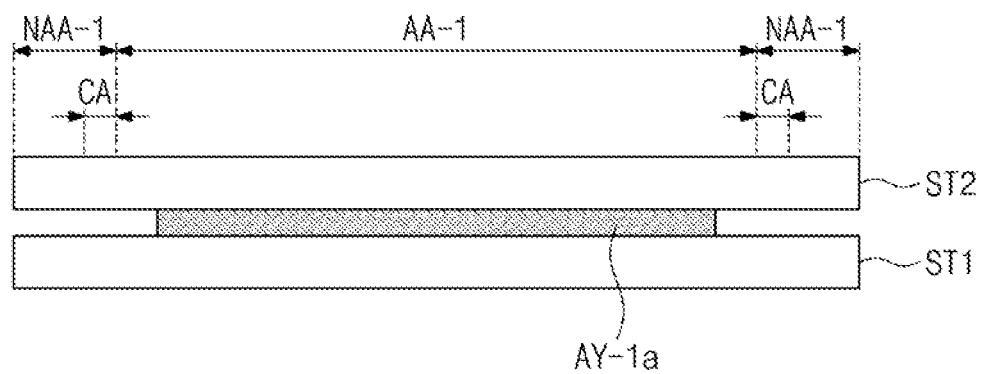

Referring to FIG. 6D, after an alignment operation is performed on the first substrate ST1 and the second substrate ST2, the second substrate ST2 may be in contact with the first adhesive layer AY-1a. Then, a cutting operation of the substrates ST1 and ST2 may be performed using the laser module LR described with reference to FIGS. 4A to 4C.

Although the embodiments of the present disclosure have been described, it is understood that the present disclosure should not necessarily be limited to these embodiments, and that various changes and modifications can be made by one ordinary skilled in the art within the spirit and scope of the present disclosure as hereinafter claimed. Therefore, the disclosed subject matter should not necessarily be limited to any single embodiment described herein, and the scope of the present inventive concept shall be determined according to the attached claims.

What is claimed is:

1. A substrate-cutting method comprising:
preparing a first substrate including a plurality of first active areas spaced apart from each other and a first non-active area surrounding the first active areas;
forming an adhesive layer on the first substrate, wherein the adhesive layer comprises a plurality of adhesive portions, wherein each of the plurality of adhesive portions is disposed within a center of each of the plurality of first active areas, respectively;
disposing a second substrate on the adhesive layer, wherein the second substrate includes a plurality of second active areas spaced apart from each other and a second non-active area surrounding the plurality of second active areas; and
cutting a cutting line of the second substrate using a laser beam to form a plurality of active portions of the second substrate, wherein the cutting line corresponds to a boundary area between the second active areas and the second non-active area in which the adhesive layer is not disposed.

2. The substrate-cutting method of claim 1, wherein the plurality of first active areas respectively overlap the plurality of second active areas in a plane of the first substrate.

3. The substrate-cutting method of claim 2, wherein the plurality of first active areas has shapes corresponding to shapes of the plurality of second active areas in the plane.

4. The substrate-cutting method of claim 1, wherein the adhesive portions in the plurality of adhesive portions are spaced apart from each other.

5. The substrate-cutting method of claim 4, wherein the adhesive layer further comprises a sub-adhesive portion overlapping the first non-active area.

6. The substrate-cutting method of claim 4, wherein each adhesive portion of the plurality of adhesive portions has the same shape and is directly attached to the first substrate.

7. The substrate-cutting method of claim 1, further comprising cutting a cutting line of the first substrate, which corresponds to a boundary area between the first active areas and the first non-active area.

8. The substrate-cutting method of claim 1, further comprising:
disposing a suction pad onto the second substrate overlapping the second non-active area after the cutting of the second substrate along the cutting line using the laser beam; and
removing the second substrate overlapping the second non-active area using the suction pad.

9. The substrate-cutting method of claim 8, further comprising removing the first substrate overlapping the first non-active area using the suction pad after the removing of the second substrate overlapping the second non-active area.

10. The substrate-cutting method of claim 1, wherein the forming of the adhesive layer comprises:
disposing a mask through which openings respectively corresponding to the first active areas are defined on the first substrate; and
coating a resin on the mask.

11. The substrate-cutting method of claim 10, wherein each of the openings does not overlap the cutting line of the first substrate, and wherein each of the openings does not overlap the cutting line of the second substrate.

12. The substrate-cutting method of claim 10, further comprising curing the resin.

* * * * *